(12) United States Patent
Zhang et al.

(10) Patent No.: US 11,460,501 B1
(45) Date of Patent: Oct. 4, 2022

(54) HIGH VOLTAGE SEMICONDUCTOR TEST SYSTEM WITH MULTIPLE SITES FOR USE WITH A PICK AND PLACE HANDLER

(71) Applicant: Silicon Laboratories Inc., Austin, TX (US)

(72) Inventors: Wenshui Zhang, Singapore (SG); Wei Jue Lim, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/241,164

(22) Filed: Apr. 27, 2021

(51) Int. Cl.
| | |
|---|---|
| *G01R 1/02* | (2006.01) |
| *G01R 1/04* | (2006.01) |
| *G01R 1/067* | (2006.01) |
| *G01R 1/073* | (2006.01) |
| *G01R 31/26* | (2020.01) |
| *G01R 31/28* | (2006.01) |

(52) U.S. Cl.
CPC ....... *G01R 31/2887* (2013.01); *G01R 1/0441* (2013.01)

(58) Field of Classification Search
CPC .......... G01R 1/02; G01R 1/04; G01R 1/0441; G01R 1/067; G01R 1/073; G01R 31/26; G01R 31/28; G01R 31/2808; G01R 31/2887
See application file for complete search history.

(56) References Cited

U.S. PATENT DOCUMENTS

| | | | |
|---|---|---|---|
| 10,551,411 B2 * | 2/2020 | Caudle | G01R 31/2893 |
| 2009/0102457 A1 * | 4/2009 | Vayner | G01R 31/2889 324/756.01 |

* cited by examiner

*Primary Examiner* — Neel D Shah
(74) *Attorney, Agent, or Firm* — Gary Stanford; Huffman Law Group, PC

(57) ABSTRACT

A test system for high voltage testing of semiconductor devices including at least one test socket and a docking plate assembly. Each test socket includes a socket enclosure for encompassing first and second contact finger assemblies, in which the socket enclosure may include a cover and alignment plate. At least one test socket is embedded within the docking plate assembly which is configured to mount between high voltage test head and a pick and place handler. The docking plate assembly and each test socket includes one or more site openings each for receiving a corresponding device under test (DUT) during a high voltage test procedure. Each contact finger assembly includes at least one contact finger configured as an elongated conductor with a bent tip for electrically interfacing a pad of the DUT.

18 Claims, 14 Drawing Sheets

HIGH VOLTAGE SEMICONDUCTOR TEST SYSTEM WITH MULTIPLE SITES FOR USE WITH A PICK AND PLACE HANDLER

BACKGROUND OF THE INVENTION

Field of the Invention

The present invention relates in general to semiconductor testing, and more particularly to a high voltage semiconductor test system with multiple sites for use with a pick and place handler.

Description of the Related Art

Existing high voltage test systems using gravity feed integrated circuit (IC) or semiconductor device handlers suffer from many deficiencies, such as, for example, low device throughput, device jams, and arcing problems. Such high voltage test systems typically provide for only a single IC to be tested at a time. Despite application of anti-static spray and adjustment of the sliding angle of conventional gravity feed handlers, semiconductor devices, including small outline integrated circuits (SOICs) and dual flat no lead (DFN) devices and the like, still frequently get stuck in various locations of the gravity feed handler. The design of the electrical interface of existing high voltage test sockets are unable to establish proper contact with the sunken pads of DFN packages of certain IC and semiconductor products typically causing electrical arcing issues resulting in inconsistent test yield results. Device jam and arcing problems further exacerbate the low throughput problem.

Pick and place handlers are known, such as described in U.S. Pat. No. 10,551,411. The mechanical hardware described therein (e.g., docking plate, stiffener, test sockets, etc.) for the radio frequency (RF) test solution cannot be implemented for high voltage testing because the hardware was designed to support test electronics derived from RF test requirements. The mechanical hardware for the high voltage testing, therefore, differs entirely from the RF test solution. In addition, the electrical interface with the device under test (DUT) includes an array of spring-loaded pogo pins or the like can be complex, expensive to implement, difficult to maintain, and generally not suitable for high voltage testing.

SUMMARY OF THE INVENTION

A test system for high voltage testing of one or more semiconductor devices, including at least one test socket and a docking plate assembly. Each test socket includes a conductive first contact finger assembly positioned opposite a conductive second contact finger assembly within a hollow area of a socket enclosure to collectively form at least one test interface for a corresponding one of at least one device under test (DUT). The first and second contact finger assemblies each have at least one elongated conductor with a bent tip for electrically interfacing a corresponding pad of a DUT. An upper surface of the socket enclosure includes at least one site opening for receiving and aligning each DUT with a corresponding test interface. The docking plate assembly has a cavity area that embeds one or more test sockets. The docking plate assembly has a first side for mounting to a high voltage test head for applying a high voltage between the first contact finger assembly and the second contact finger assembly, and has a second side for mounting to a test area of a pick and place handler for high voltage testing. The second side of the docking plate assembly has at least one site opening, each aligned with a corresponding site opening of the socket enclosure for receiving and aligning a corresponding DUT with a corresponding test interface.

The first contact finger assembly may include at least one group of first contact fingers in which each group of first contact fingers is positioned to align with a corresponding one of a first set of pads of the DUT at a corresponding test interface. The second contact finger assembly may include at least one group of second contact fingers in which each group of second contact fingers is positioned to align with a corresponding one of a second set of pads of the DUT at a corresponding test interface. Each of the first contact fingers and each of the second contact fingers may include an elongated conductor with a bent tip.

The first contact finger assembly may include first and second groups of first contact fingers, and the second contact finger assembly may include first and second groups of second contact fingers. The first group of first contact fingers and the first group of second contact fingers are positioned opposite each other to collectively form a first test interface for a first DUT, and the second group of first contact fingers and the second group of second contact fingers are positioned opposite each other to collectively form a second test interface for a second DUT. The upper surface of the socket enclosure may include a first site opening for receiving and aligning the first DUT with the first test interface, and may include a second site opening for receiving and aligning the second DUT with the second test interface. The second side of the docking plate assembly may have a first site opening aligned with the first site opening of the socket enclosure for receiving and aligning the first DUT, and may have a second site opening aligned with the second site opening of the socket enclosure for receiving and aligning the second DUT.

A terminal block may be mounted to a first one of the at least one test socket and electrically interfaced to the first contact finger assembly of the first test socket. The test system may include first and second terminal blocks for mounting to at least one test socket for receiving and applying a high voltage between the first contact finger assembly and the second contact finger assembly of each test interface of each test socket.

Each test socket may include a first test socket and a second test socket, in which the first test socket may include first and second contact finger assemblies in which the first contact finger assembly of the first test socket is electrically connected to a first terminal block, and in which the second test socket may include first and second contact finger assemblies in which the second contact finger assembly of the second test socket is electrically connected to a second terminal block. The first contact finger assembly of the first test socket may be electrically connected to the first contact finger assembly of the second test socket, and the second contact finger assembly of the first test socket may be electrically connected to the second contact finger assembly of the second test socket. The high voltage test head may include a first contact pin for electrically connecting to the first terminal block and a second contact pin for electrically connecting the second terminal block when the docking plate assembly embedded with the first and second test sockets is mounted to the high voltage test head.

The first contact finger assembly and the second contact finger assembly may each include a contact finger group, a contact finger support, and a contact finger base in a stacked configuration. The contact finger base may include a hole for receiving and electrically connecting to a terminal block for conveying high voltage. The contact finger base may include a solder area for soldering a conductive wire.

Each test socket further may include a nonconductive contact finger assembly holder positioned between the first and second contact finger assemblies for spacing and electrical isolation. The bent tip of the elongated conductor may be a pointed tip.

The socket enclosure may include a socket bottom cover formed with the hollow area, and an alignment plate that mates with the socket bottom cover to embed the first and second contact finger assemblies. The alignment plate may form the upper surface of the socket enclosure including the at least one site opening. The docket plate assembly may include a docking plate formed with the cavity area, and a back cover that encloses the cavity area of the docking plate to embed the at least one test socket. The back cover may form at least a portion of the second side of the docking plate assembly including at least one site opening in which each site opening is aligned with a corresponding site opening of the socket enclosure.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
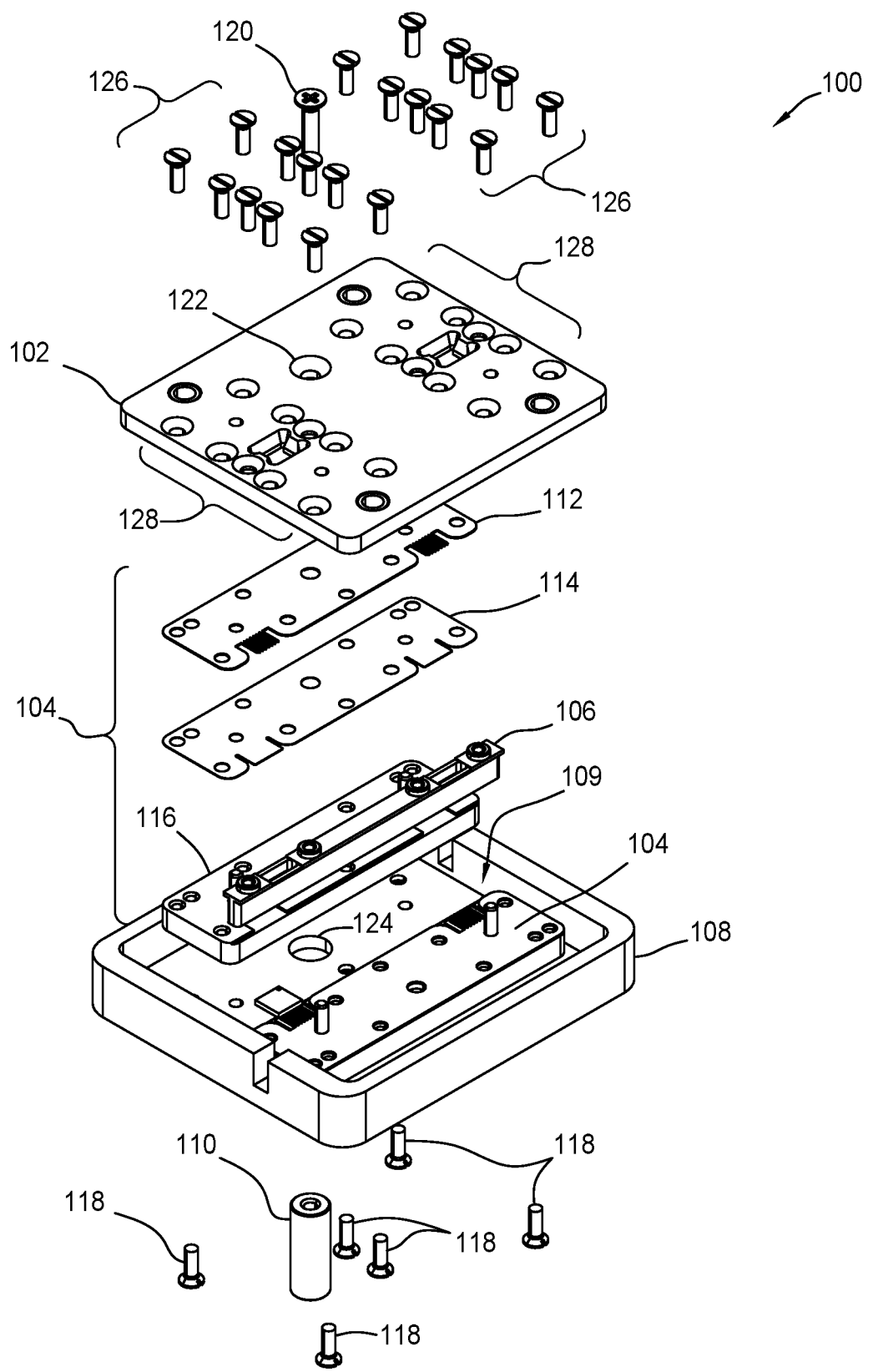
FIG. 1 is an exploded perspective view of a test socket (TS) implemented according to one embodiment of the present disclosure.

FIG. 1 is an exploded perspective view of a test socket (TS) 100 implemented according to one embodiment of the present disclosure. The TS 100 includes an alignment plate assembly (APA) 102, a pair of contact finger assemblies (CFA) 104, a contact finger assembly holder (CFAH) 106, a socket bottom cover (SBC) 108 with a recessed or hollow area 109, a terminal block (TB) 110, and several sets of screws for fastening the different parts of the TS 100 together. The APA 102 and the SBC 108 collectively form a socket enclosure that embeds the pair of CFAs 104 within the hollow area 109. One of the CFAs 104 is assembled and shown positioned on one side of the hollow area 109 of the SBC 108, and the other is shown as an exploded view. As illustrated by the exploded view, each CFA 104 includes a contact finger group (CFG) 112, a contact finger support (CFS) 114, and a contact finger base (CFB) 116. The pair of CFAs 104 are placed on either side of the CFAH 106 within the hollow area 109 of the SBC 108 and held in place by a first set of screws 118. Another screw 120 is inserted from above through a hole 122 of an alignment plate (AP) 202

(FIG. 2) of the APA 102, through a hole of a corresponding one of the CFAs 104, and through a hole 124 of the SBC 108 into a top end of the TB 110 for securing the TB 110 to the TS 100. Yet another set of screws 126 are screwed through corresponding holes 128 along an upper surface of the AP 202 of the APA 102 into corresponding holes along an upper surface of the CFAs 104 to hold the TS 100 together.

It is noted that only one TB 110 is shown mounted on one side of the TS 100 to a corresponding one of the CFAs 104. In an alternative embodiment, a pair of TBs 110 may be mounted to the TS 100, each to a corresponding one of the CFAs 104. It is understood, however, that the size and form of the TS 100 may be modified to meet the spacing between the TBs 110 to electrically contact and interface corresponding contact pins 1306A and 1306B, respectively, of a high voltage test head (HVH) 1302 (FIG. 13), or that the spacing between the contact pins 1306A and 1306B be modified accordingly. In the illustrated embodiment, the CFAs 104 may be symmetrical and substantially identical to each other yet positioned opposite each other within the hollow area 109 of the TS 100. As further described herein, the CFG 112 of each CFA 104 includes at least one group of elongated conductive contact fingers 2102 (FIG. 21) which forms one side of a pair of test sites or test interfaces 2002 (FIG. 20) for receiving and testing high voltage (HV) response of a corresponding device under test (DUT) 702 (FIGS. 7, 19, 22, 23, and 24).

The CFG 112, the CFS 114 and the CFB 116 of each CFA 104 are conductive and the TB 110 is conductive to charge a corresponding one of the CFAs 104 with a polarity of a high voltage signal as further described herein. The APA 102, the SBC 108 and the CFAH 106 are made of nonconductive materials. The CFAH 106 is configured to establish proper spacing and electrical isolation between the pair of CFAs 104.

Figure 9:
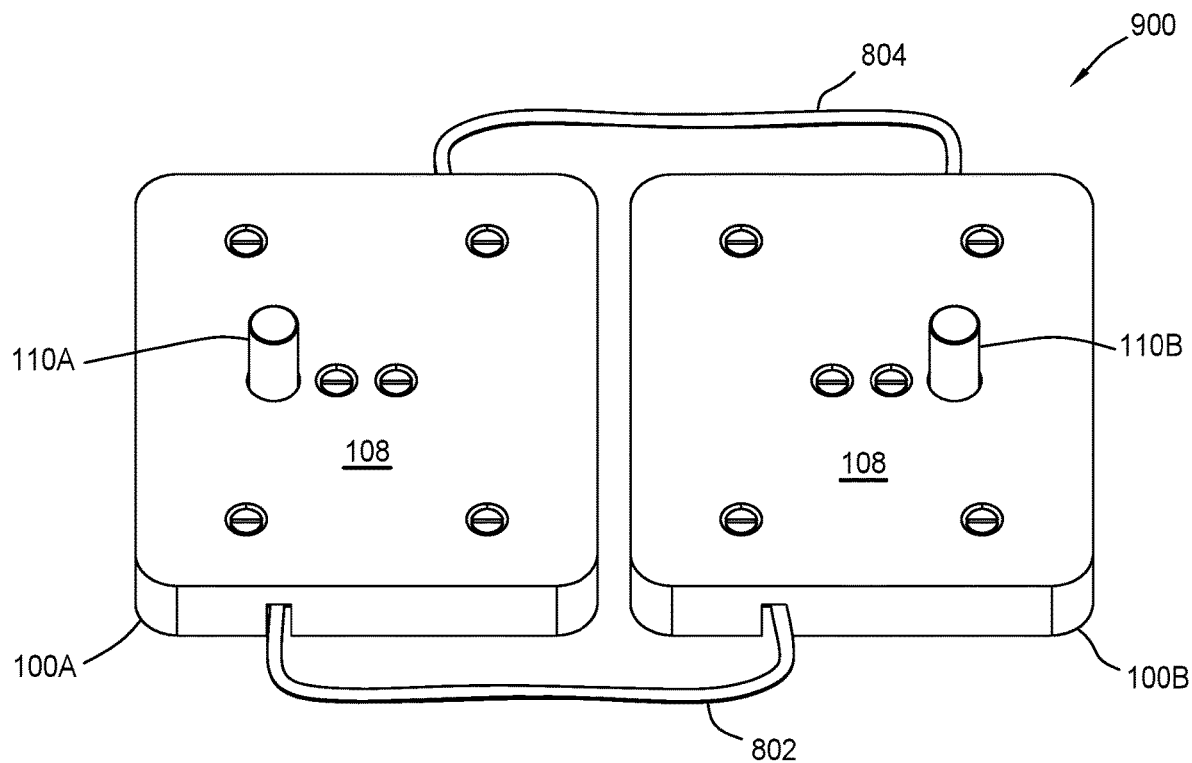
FIG. 9 is a bottom view of a wired TS assembly implemented according to one embodiment of the present disclosure.

In the illustrated embodiment, the TS 100 is shown as a dual-site test socket for implementing two test interfaces 2002 for testing up to 2 DUTs 702 at a time. In an alternative embodiment, the TS 100 may be configured with only one test interface 2002 for receiving one DUT 702 at a time. As further described herein, one or more TSs 100 may be embedded within a docking plate assembly (DPA) 1000 (FIG. 10) in which each TS 100 receives one or more DUTs 702 for testing up to a multiple number of DUTs 702 at a time. When only one TS 100 is embedded, it may be configured with a pair of TBs 110. When multiple TSs 100 are embedded, one of the TSs 100 may be configured with both TBs 110 or two of the TSs 100 each have one TB 110 (such as shown in FIG. 9 for two TSs 100A and 100B).

Figure 2:
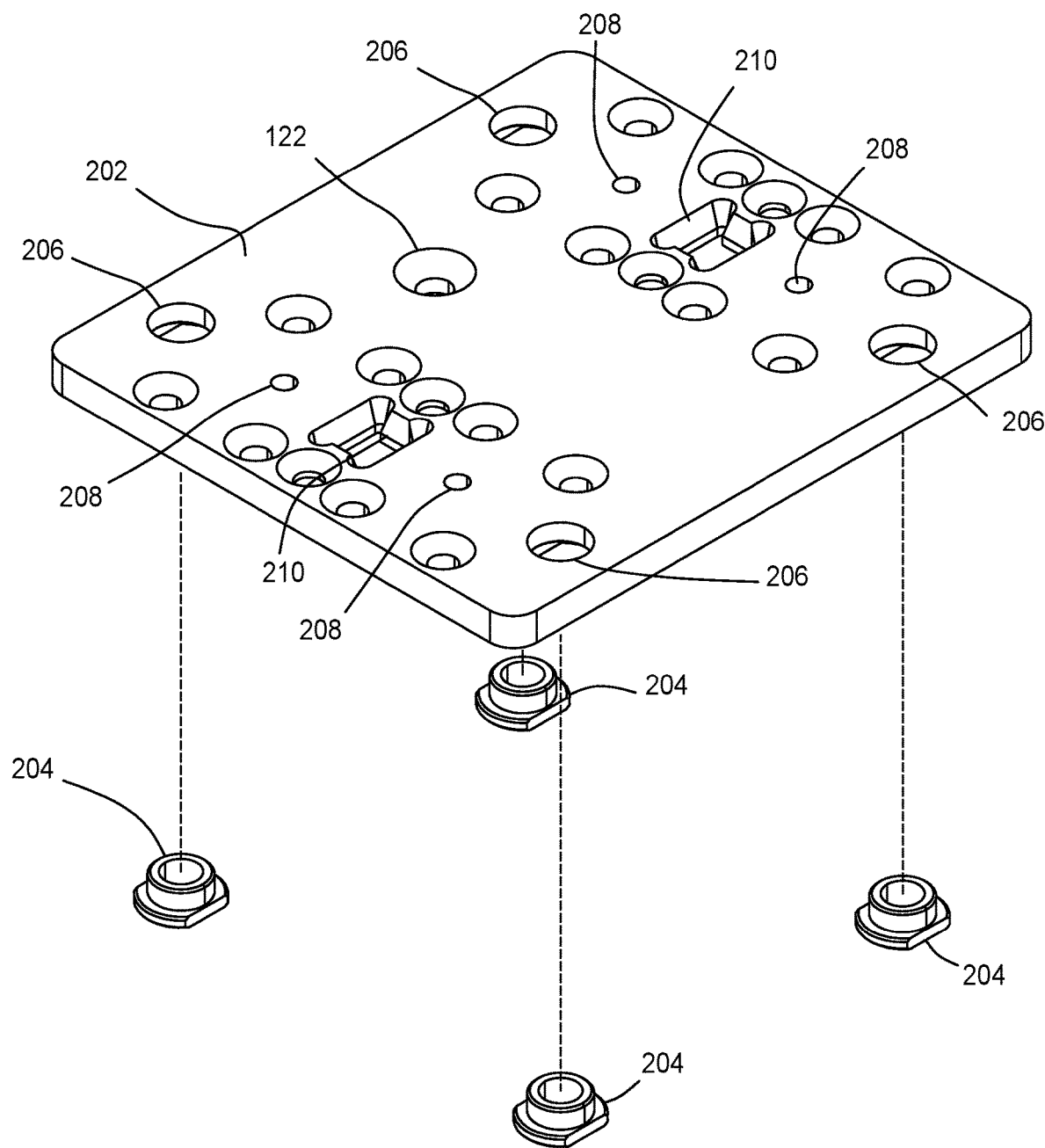
FIG. 2 is an exploded perspective view of an alignment plate assembly (APA) of FIG. 1 implemented according to one embodiment of the present disclosure.

FIG. 2 is an exploded perspective view of the APA 102 implemented according to one embodiment of the present disclosure. The APA 102 includes the AP 202 and a set of screw inserts 204. Each screw insert 204 is installed by being press-fitted within a corresponding hole 206 in the AP 202. The illustrated configuration includes four screw inserts 204 and four corresponding holes 206, which are used to mount the TS 100 to a docking plate 1002 (FIG. 10) of the DPA 1000 (see, e.g., FIG. 12) as described further herein. The AP 202 further includes four dowel holes 208 for aligning the APA 102 with the CFAs 104 as further described herein. The AP 202 further includes two site openings 210 for receiving and aligning two semiconductor devices for high voltage testing, each referred to as a device under test (DUT).

Figure 3:
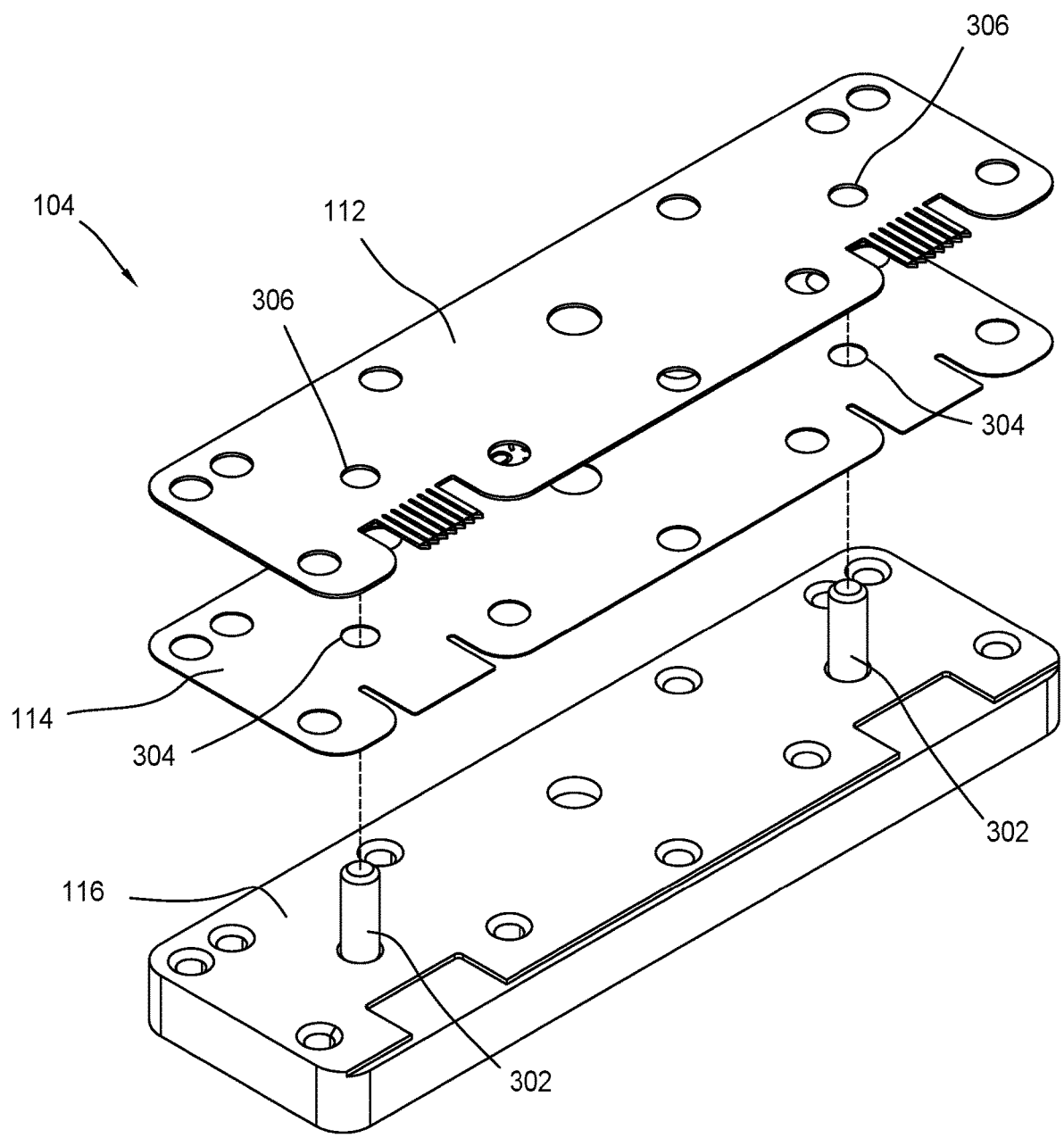
FIG. 3 is an exploded perspective view of each contact finger assembly (CFA) of FIG. 1 implemented according to one embodiment of the present disclosure.

FIG. 3 is an exploded perspective view of the CFA 104 implemented according to one embodiment of the present disclosure. As previously described, the CFA 104 includes the CFG 112, the CFS 114, and the CFB 116 stacked together on top of each other as shown to form the CFA 104. In addition, a pair of dowel pins 302 are press-fitted into corresponding holes along the upper surface of the CFB 116 to provide alignment for the CFG 112 and the CFS 114 during assembly of the CFA 104. In addition, the CFS 114 includes a pair of holes 304 and the CFG 112 includes another pair of holes 306 for alignment with the dowel pins 302 when assembling the CFA 104. In addition, the dowel pins 302 of each CFA 104 are inserted into a corresponding pair of the holes 208 for alignment of the AP 202 during socket assembly, as well as alignment to the docking plate 1002 during assembly of the DPA 1000 as further described herein.

Figure 4:
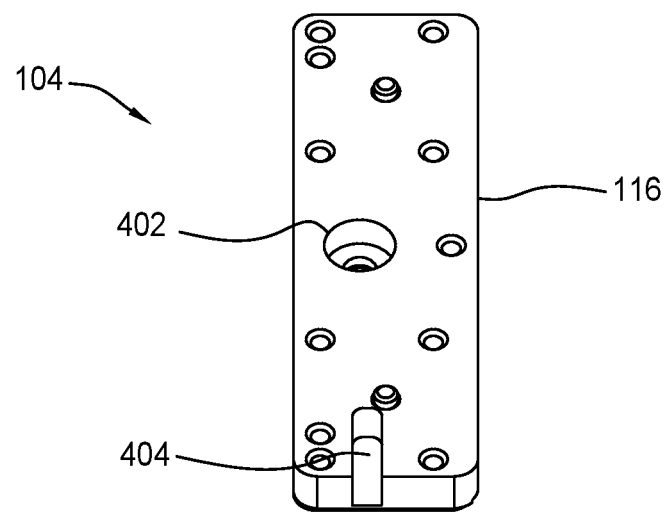
FIG. 4 is a bottom view of the CFA of FIG. 1 implemented according to one embodiment of the present disclosure illustrating a contact finger base (CFB) of the CFA.

FIG. 4 is a bottom view of the CFA 104 implemented according to one embodiment of the present disclosure. As shown, the lower surface of the CFB 116 of the CFA 104 includes a hole 402 for receiving and electrically connecting the TB 110 to the CFA 104 during socket assembly. In addition, the CFB 116 of the CFA 104 includes a solder area 404 to solder a conductive wire for electrically connecting another CFA 104 to be charged with the same voltage polarity during high voltage testing as further described herein.

Figure 5:
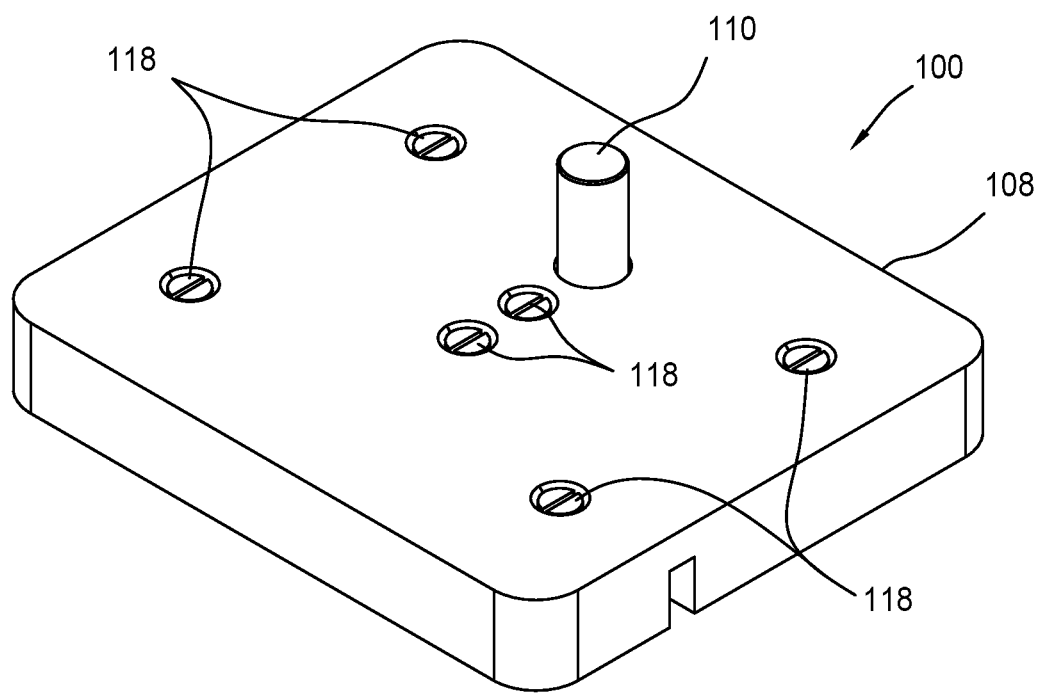
FIG. 5 is a bottom view of the assembled TS of FIG. 1 implemented according to one embodiment of the present disclosure.

FIG. 5 is a bottom view of the assembled TS 100 implemented according to one embodiment of the present disclosure. Each of the screws 118 is inserted into a corresponding one of multiple holes distributed along the lower surface of the SBC 108 into holes (not shown) along a lower surface of the CFB 116 of a respective one of the CFAs 104 and tightened to mount the CFAs 104 to the SBC 108. The screws 118 are shown mounted for securing each of the pair of CFAs 104 to the SBC 108. Also shown is the TB 110 installed through the SBC 108 and into a corresponding one of the CFAs 104 of the TS 100.

Figure 6:
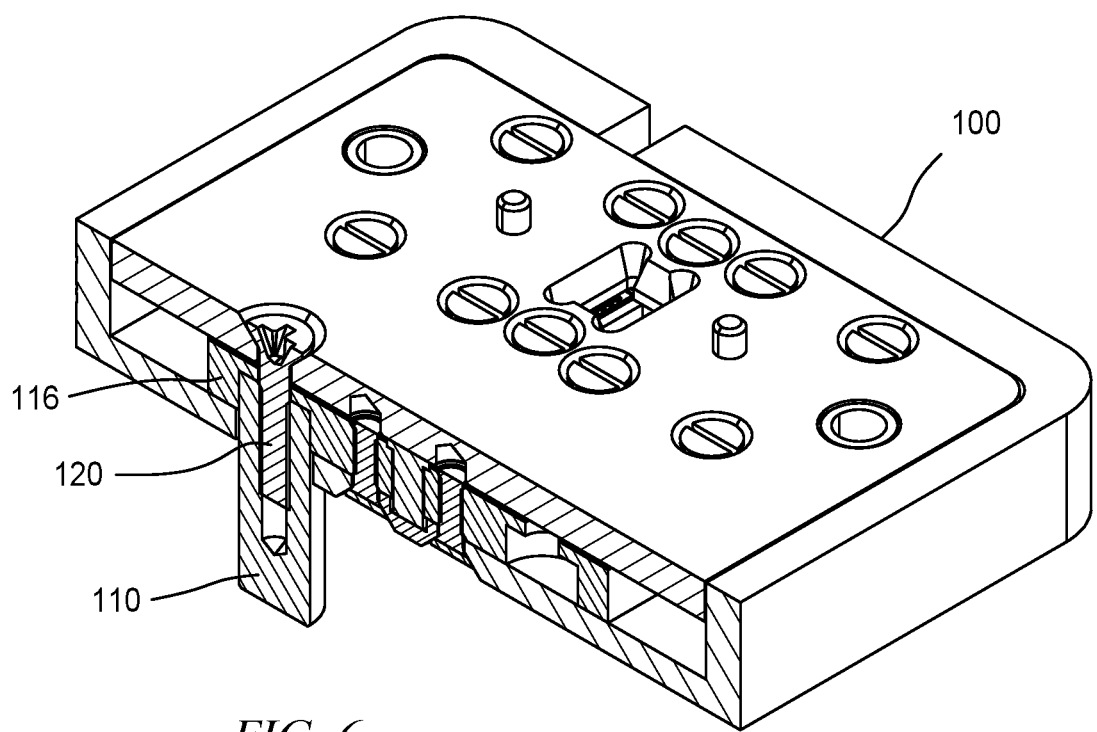
FIG. 6 is a cross-sectional perspective view illustrating a terminal block (TB) of FIG. 1 shown in cross-section mounted to the TS according to one embodiment of the present disclosure.

FIG. 6 is a cross-sectional perspective view illustrating the TB 110 (shown in cross-section) mounted to the TS 100 using the screw 120 (also shown in cross-section) as previously described according to one embodiment of the present disclosure. The screw 120 is tightened to force the conductive TB 110 the electrically interface the CFB 116 to ensure a secure electrical bond. Also, the TS 100 includes only one TB 110 mounted on one side for receiving high voltage as further described herein.

Figure 7:
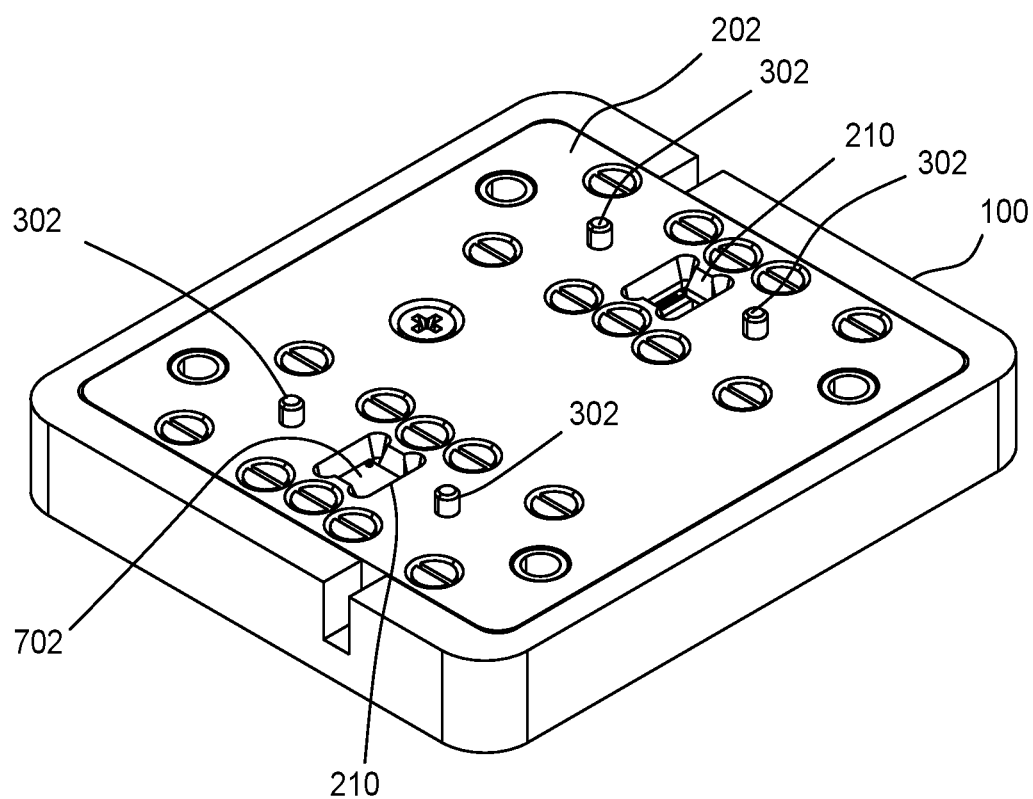
FIG. 7 is a perspective view of the assembled TS of FIG. 1 implemented according to one embodiment of the present disclosure.

FIG. 7 is a perspective view of the assembled TS 100 implemented according to one embodiment of the present disclosure. As shown, the dowel pins 302 extend through corresponding holes of the AP 202 for aligning the TS 100 with the docking plate 1002. The two site openings 210 are shown along the top surface of the socket enclosure formed by assembled TS 100, in which one of the site openings 210 is empty while the other includes a DUT 702 inserted therein for high voltage testing as further described herein.

Figure 8:
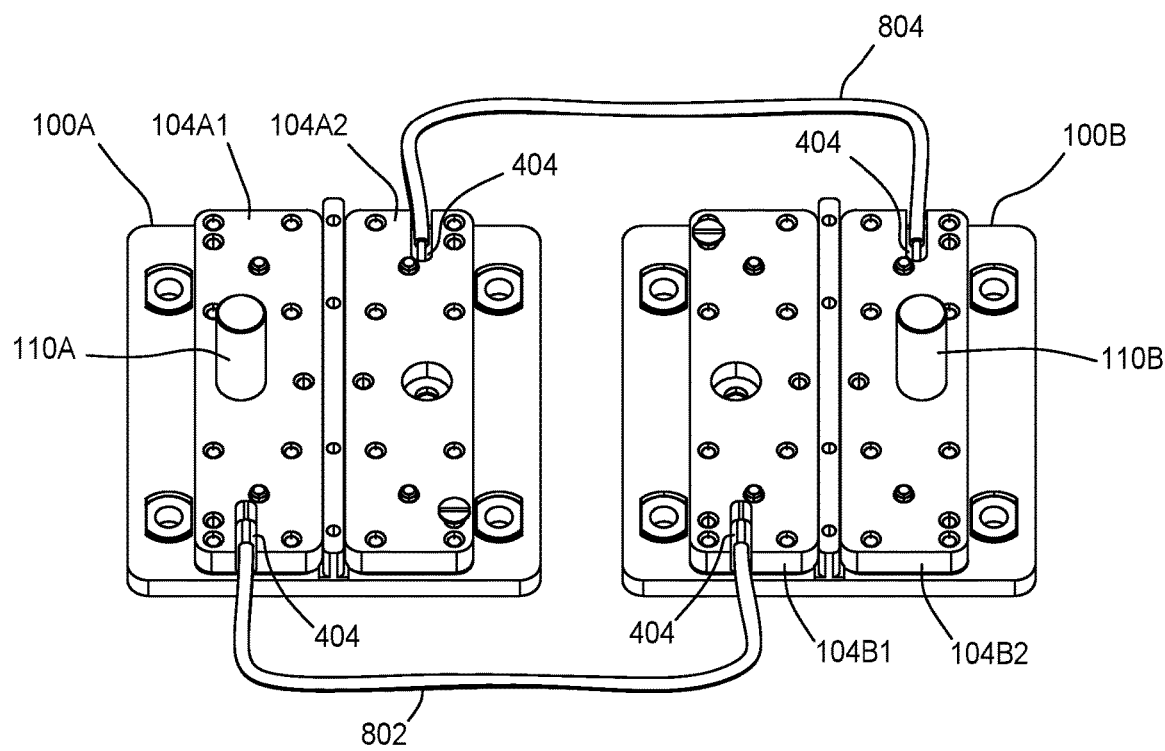
FIG. 8 is a bottom view of a pair of TSs of FIG. 1 each having their corresponding socket bottom cover (SBC) removed for showing high voltage wiring to corresponding CFAs implemented according to one embodiment of the present disclosure.

FIG. 8 is a bottom view of a pair of TSs 100, shown as TS 100A and TS 100B, each having their corresponding SBC 108 removed for showing high voltage wiring to corresponding CFAs 104 implemented according to one embodiment of the present disclosure. The TS 100A includes a pair of conductive CFAs 104A1 and 104A2 and the TS 100B includes a pair of conductive CFAs 104B1 and 104B2, each configured in substantially identical manner as the CFA 104 and each including the solder area 404. It is noted that the TS 100A includes a conductive TB 110A mounted to the CFA 104A1 and that the TS 100B includes another conductive TB 110B mounted to the CFA 104B2. A first wire 802 is soldered between the solder areas 404 of the CFAs 104A1 and 104B1 to electrically connect them to each other, and a second wire 804 is soldered between the solder areas 404 of the CFAs 104A2 and 104B2 to electrically connect them to each other. In this manner, when a voltage A is applied to the TB 110A and a voltage B is applied to TB 110B during high voltage testing, the CFAs 104A1 and 104B1 are both charged with the same voltage polarity A while the CFAs 104B1 and 104B2 are both charged with the same voltage polarity B.

FIG. 9 is a bottom view of a wired TS assembly 900 implemented according to one embodiment of the present disclosure. A corresponding SBC 108 is mounted to complete each of the TSs 100A and 100B (as shown by the TS 100 in FIG. 1), and the completed pair of TSs 100A and 100B wired together by the corresponding wires 802 and 804 form the wired TS assembly 900. The TBs 110A and 110B protrude for interfacing high voltage test equipment for receiving the high voltage polarities A and B as described herein.

Figure 10:
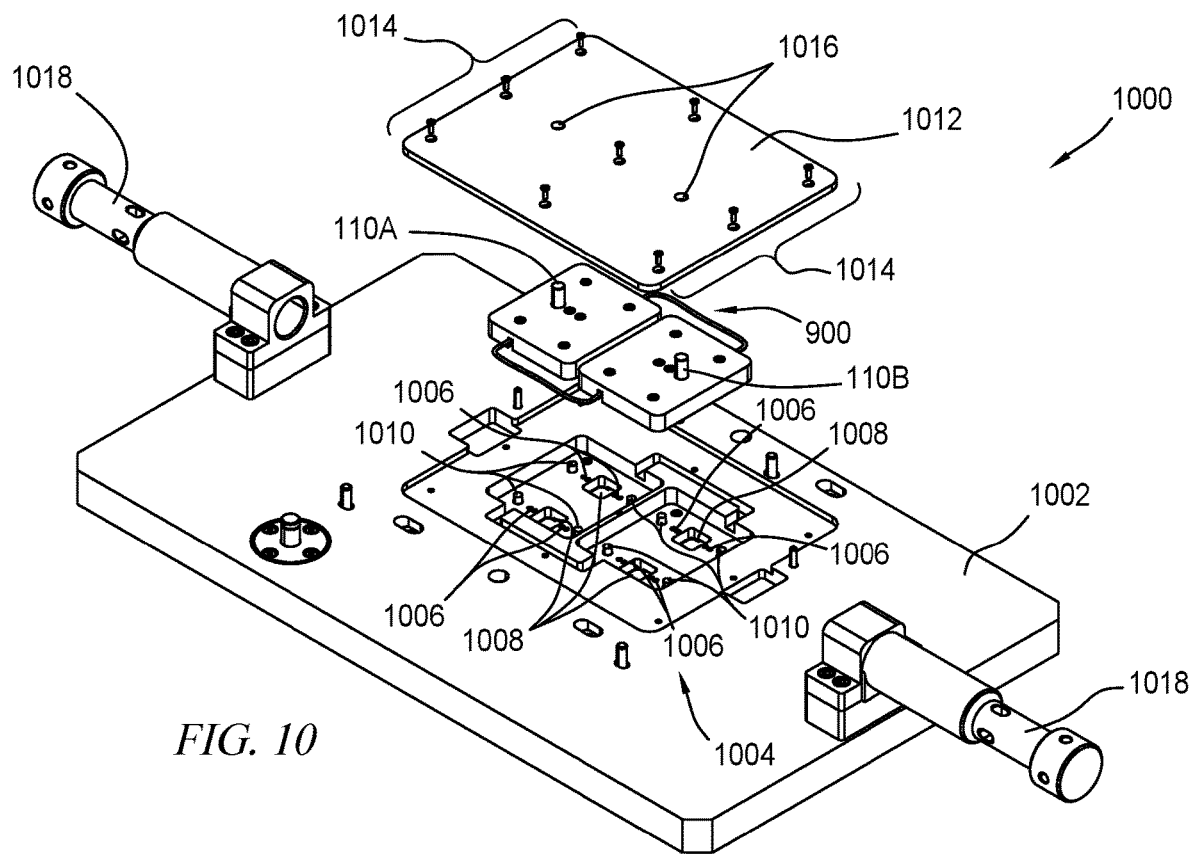
FIG. 10 is an exploded perspective bottom view illustrating assembly of a docket plate assembly (DPA) implemented according to an embodiment of the present disclosure.

FIG. 10 is an exploded perspective bottom view illustrating assembly of the DPA 1000 implemented according to an embodiment of the present disclosure. The DPA 1000 includes the docking plate 1002 made of a nonconductive material and configured to receive and encompass the wired TS assembly 900. The bottom surface of the docking plate 1002 includes a cavity area 1004 having a shape and size to receive and encompass the wired TS assembly 900 for embedding within the DPA 1000. The cavity area 1004 includes a pair of rectangular cavities and corresponding slots for receiving and containing the TSs 100A and 100B along with the wires 802 and 804. Each rectangular cavity further includes four holes 1006 for receiving the ends of the dowel pins 302 protruding from the TSs 100A and 100B to align and install the TSs 100A and 100B within the cavity area 1004. Each rectangular cavity further includes a pair of site openings 1008 that open to the top side of the docking plate 1002 that are aligned with the site openings 210 of each of the TSs 100A and 100B, in which each site opening 1008 is for receiving a corresponding DUT 702 during testing as further described herein.

Each rectangular cavity further includes four holes 1010 that are aligned with the four screw inserts 204 installed within the holes 206 as previously described for securing each of the TSs 100A and 100B of the wired TS assembly 900 to the docking plate 1002 as further described herein. The DPA 1000 further includes a back cover 1012 (also made of a nonconductive material) that is fashioned to cover and enclose the cavity area 1004 to embed the wired TS assembly 900 within the cavity area 1004 of the docking plate 1002. A set of screws 1014 may be used to fasten the back cover 1012 to the docking plate 1002. The back cover 1012 includes a pair of holes 1016 aligned with the TBs 110A an 110B for allowing the TBs 110A and 110B to protrude from the back cover 1010 of the assembled DPA 1000. A pair of handles 1018 are mounted on opposite ends of the docking plate 1002.

Figure 11:
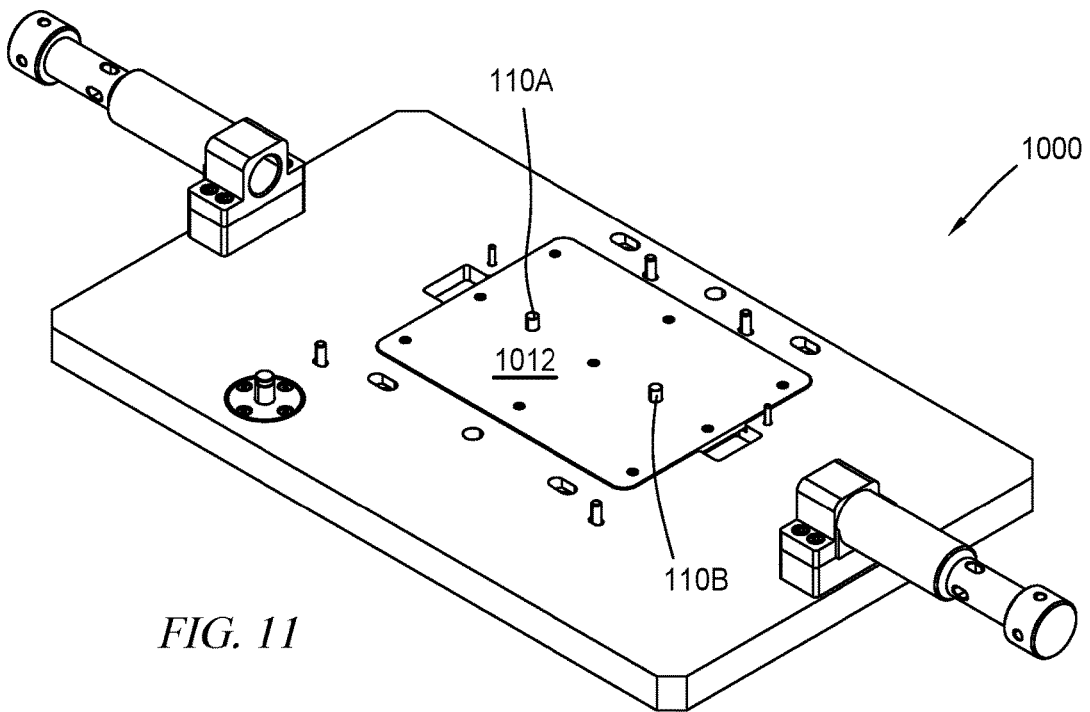
FIG. 11 is a perspective bottom view of the DPA of FIG. 10 after assembly according to one embodiment of the present disclosure.

FIG. 11 is a perspective bottom view of the DPA 1000 after assembly according to one embodiment of the present disclosure. The TBs 110A and 110B are shown protruding from the back cover 1012 for electrically contacting and interfacing corresponding contact pins 1306A and 1306B, respectively, of the HVH 1302 as further described herein.

Figure 12:
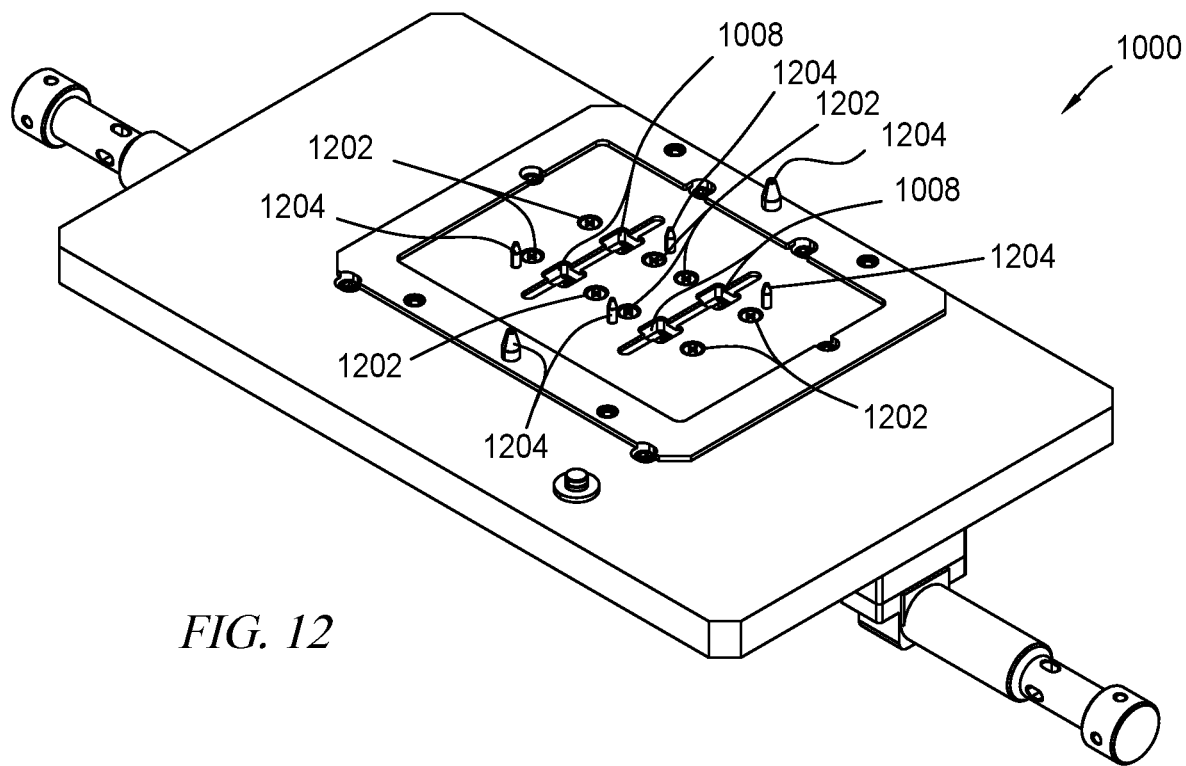
FIG. 12 is a perspective top view of the DPA of FIG. 10 after assembly according to one embodiment of the present disclosure.

FIG. 12 is a perspective top view of the DPA 1000 after assembly according to one embodiment of the present disclosure. A set of 8 screws 1202 are shown screwed into the upper side of the DPA 1000, in which each screw 1202 is screwed into a corresponding one of the screw inserts 204 to secure the TSs 100A and 100B of the wired TS assembly 900 to the docking plate 1002 to complete assembly of the DPA 1000. The four site openings 1008 are shown along the top surface of the DPA 1000, each aligned with a corresponding one of the site openings 210 of the TSs 100A and 100B. One or more guide pins 1204 of various sizes and at various locations are mounted along the upper side of the DPA 1000 for alignment with corresponding holes (not shown) of a test area (not shown) of a pick and place (P&P) handler 1702 (FIG. 17) as further described herein.

Figure 13:
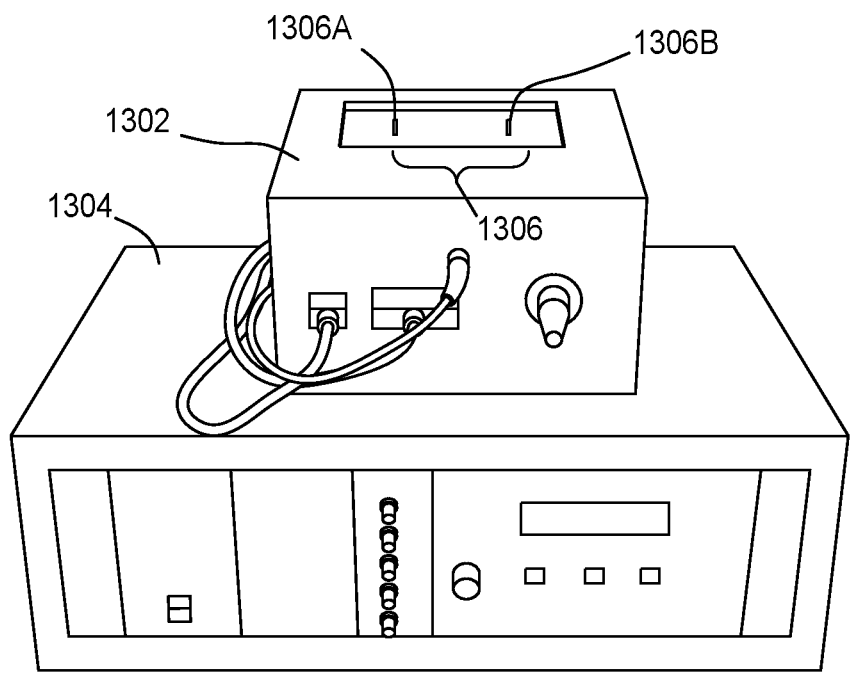
FIG. 13 is a perspective view of a high voltage test head (HVH) and a control unit for performing a test procedure according to one embodiment of the present disclosure.

FIG. 13 is a perspective view of the HVH 1302 and a control unit 1304 for performing a test procedure according to one embodiment of the present disclosure. The control unit 1304 is not further described. The HVH 1302 includes the pair of contact pins 1306 including a contact pin 1306A that electrically interfaces the TB 110A and a contact pin 1306B that electrically interfaces the TB 110B when the DPA 1000 is mounted to the HVH 1302 as further described herein. It is noted that the TS 100, and thus the TSs 100A and 100B and the corresponding wired TS assembly 900 may each configured with the pair of TBs 110 (e.g., 110A, 110B) to meet the specific spacing between the pair of contact pins 1306A and 1306B. Yet it is also contemplated that the particular spacing between the contact pins 1306A and 1306B is arbitrary and may be modified in alternative configurations.

Figure 14:
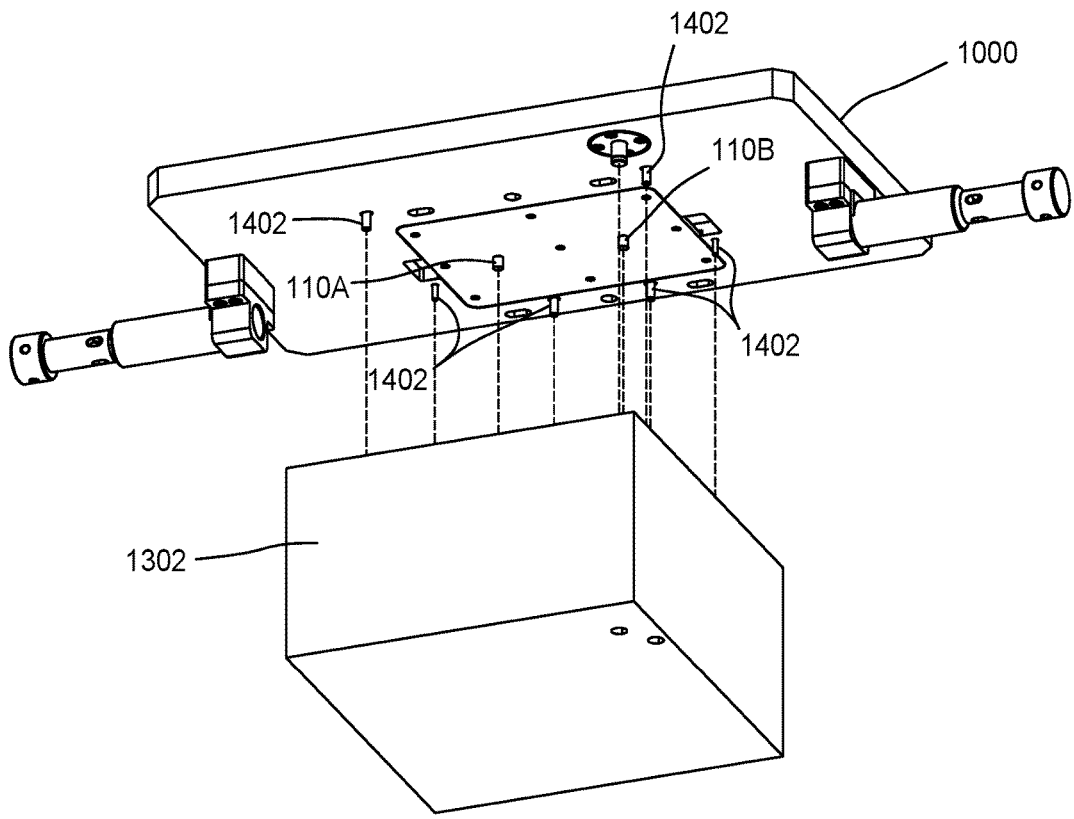
FIG. 14 is an exploded perspective view illustrating mounting of the DPA of FIG. 10 onto the HVH of FIG. 13 according to one embodiment of the present disclosure.

FIG. 14 is an exploded perspective view illustrating mounting of the DPA 1000 onto the HVH 1302 according to one embodiment of the present disclosure. A set of screws 1402 are shown protruding from the lower surface of the DPA 1000 which have been inserted from the upper surface of the DPA 1000. The screws 1402 are inserted into corresponding holes (not shown) along the upper surface of the HVH 1302 for mounting the DPA 1000 onto the HVH 1302. The TBs 110A and 110B are shown protruding from the lower surface of the DPA 1000 which are aligned with to electrically interface the contact pins 1306A and 1306B, respectively, of the HVH 1302.

Figure 15:
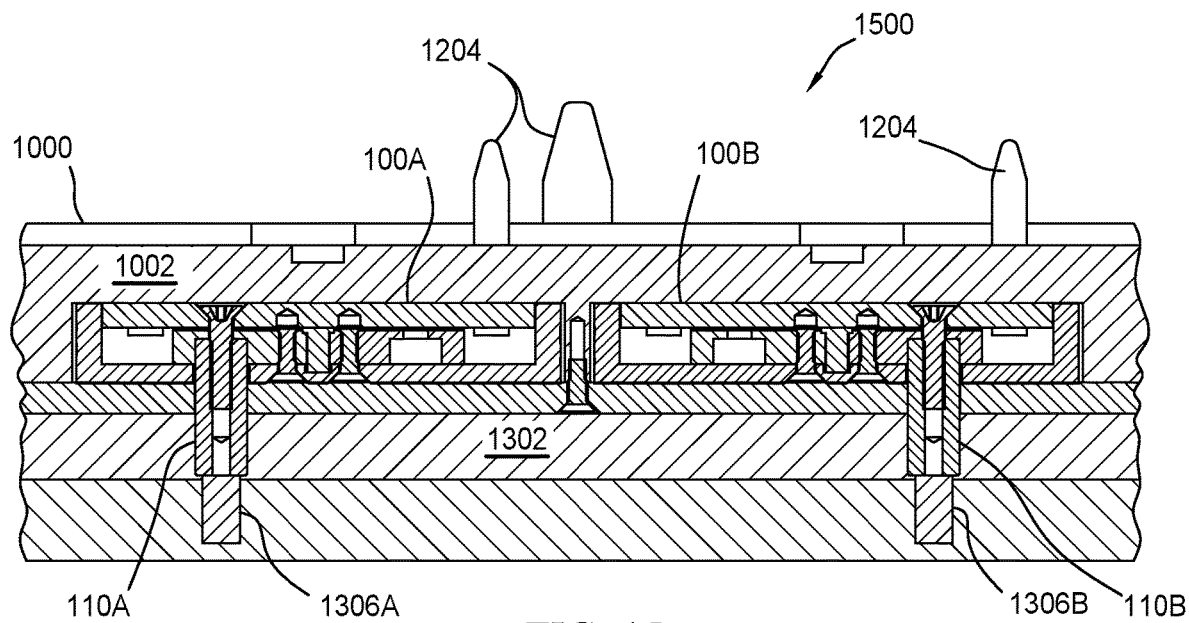
FIG. 15 is a partial cross-sectional side view of the DPA of FIG. 10 mounted to the HVH of FIG. 13 forming a test head assembly implemented according to one embodiment of the present disclosure.

FIG. 15 is a partial cross-sectional side view of the DPA 1000 mounted to the HVH 1302 forming a test head assembly 1500 implemented according to one embodiment of the present disclosure. The docking plate 1002 of the DPA 1000 embeds the TSs 100A and 100B. The TB 110A of the TS 100A is inserted into the HVH 1302 to electrically connect to the contact pin 1306A and the TB 110B of the TS 100B is inserted into the HVH 1302 to electrically connect to the contact pin 1306B. In a more specific embodiment, the contact pins 1306A and 1306B are spring-loaded and the TBs 110A and 110B are pushed down onto the spring-loaded contact pins 1306A and 1306B, respectively, to establish electrical contact between the HVH 1302 and the TSs 100A and 100B of the wired TS assembly 900. In this manner, when the HVH 1302 applies the high voltage across the voltage polarities A and B to the contact pins 1306A and 1306B, respectively, the A voltage polarity is conveyed to the CFAs 104A1 and 104B1 and the B voltage polarity is conveyed to the CFAs 104A2 and 104B2 as previously described and as shown in FIG. 8. The guide pins 1204 are shown protruding above the DPA 1000 for alignment with the corresponding holes of the test area of the P&P handler 1702 as previously described.

Figure 16:
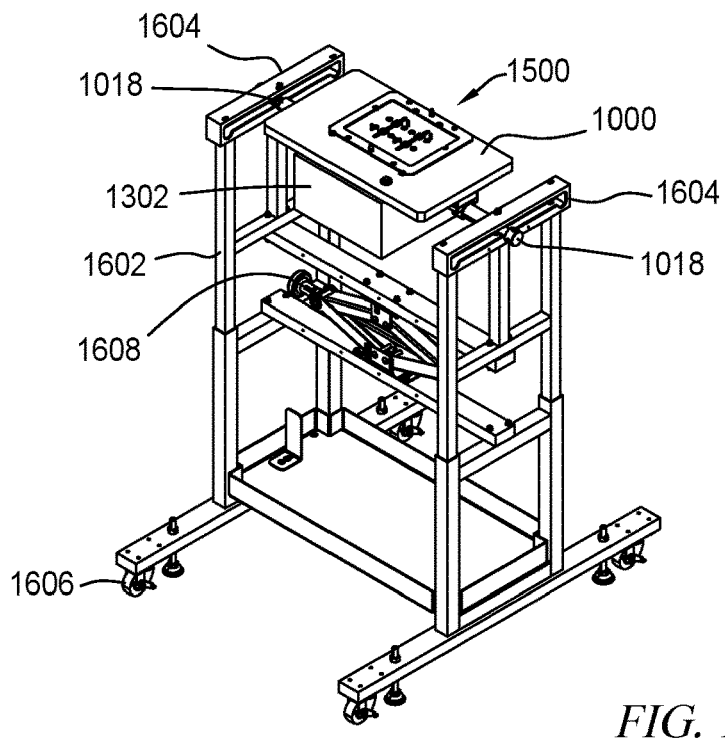
FIG. 16 is a perspective view of the test head assembly of FIG. 15 mounted to a carrier cart according to one embodiment of the present disclosure.

FIG. 16 is a perspective view of the test head assembly 1500, including the DPA 1000 mounted to the HVH 1302, mounted to a carrier cart 1602 according to one embodiment of the present disclosure. The carrier card 1602 includes a pair of opposing handle slots 1604 that are configured to receive and hold the handles 1018 of the DPA 1000. The handles 1018 and the handle slots 1604 are configured to allow the test head assembly 1500 to be rotated for orientation and alignment with the test area of a selected handler, including, for example, the P&P handler 1702, to keep the test head assembly 1500 held in place during testing. The carrier cart 1602 includes wheels 1605 for transporting the test head assembly 1500. The carrier cart 1602 includes a screw jack 1608 with a corresponding knob or the like for lifting or lowering the test head assembly 1500 in a vertical direction. The carrier cart 1602 is not further described in detail, but is configured to support, carry and transport the test head assembly 1500 and to manipulate the test head assembly 1500 into a desired test position and orientation.

Figure 17:
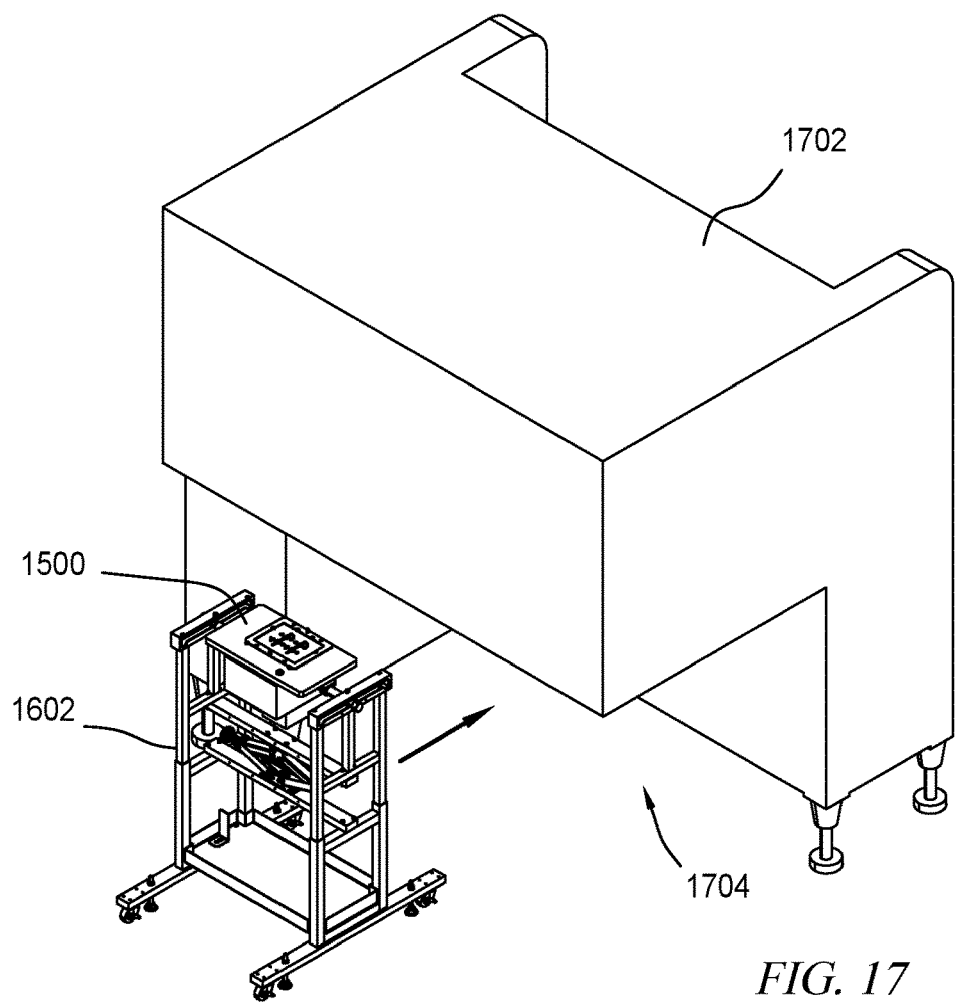
FIG. 17 is a perspective view of the carrier cart mounted with the test head assembly of FIG. 15 being moved into position within a docking area of a P&P handler for testing according to one embodiment of the present disclosure.

FIG. 17 is a perspective view of the carrier cart 1602 mounted with the test head assembly 1500 being moved into position within a docking area 1704 of the P&P handler 1702 for testing according to one embodiment of the present disclosure.

Figure 18:
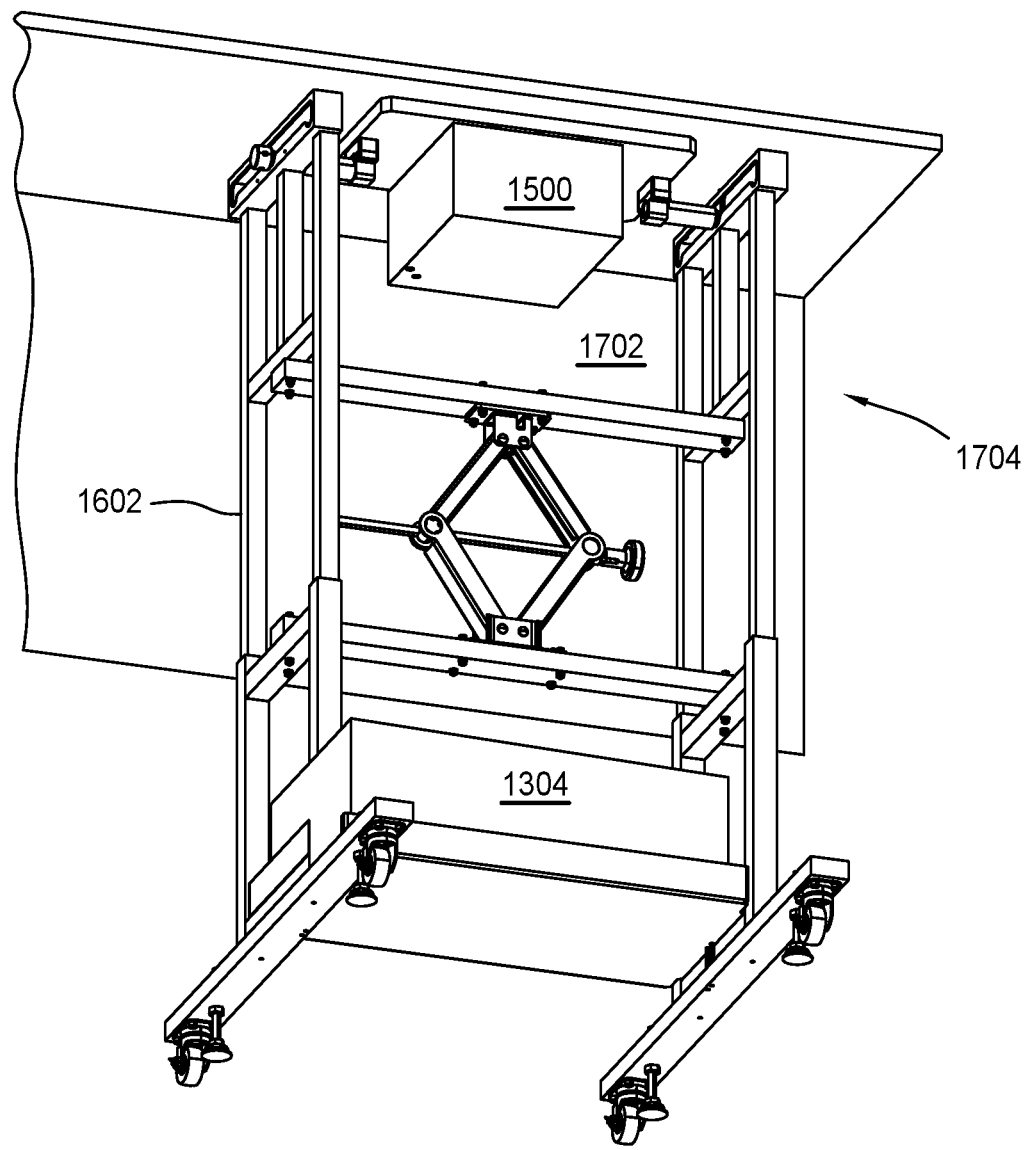
FIG. 18 is a perspective view of the test head assembly of FIG. 15 mounted to the P&P handler of FIG. 17 within a docking area of the P&P handler according to one embodiment of the present disclosure.

FIG. 18 is a perspective view of the test head assembly 1500 mounted to the P&P handler 1702 within the docking area 1704 according to one embodiment of the present disclosure. In one embodiment, the carrier cart 1602 is wheeled into a docking area of the P&P handler 1702 and the carrier cart 1602 is aligned and raised to position the test head assembly 1500 adjacent the test area of the P&P handler 1702. The floor is not shown so that the carrier cart appears to be floating, but may actually be secured to the floor to reduce movement. The guide pins 1204 are used to align the DPA 1000 of the test head assembly 1500 with the test area of the P&P handler 1702, and then the DPA 1000 is mounted to the test area of the P&P handler 1702 using screws or the like. As shown, the carrier cart 1602 may also carry the control unit 1304 which is electrically interfaced to control the HVH 1302 during the test procedure.

Figure 19:
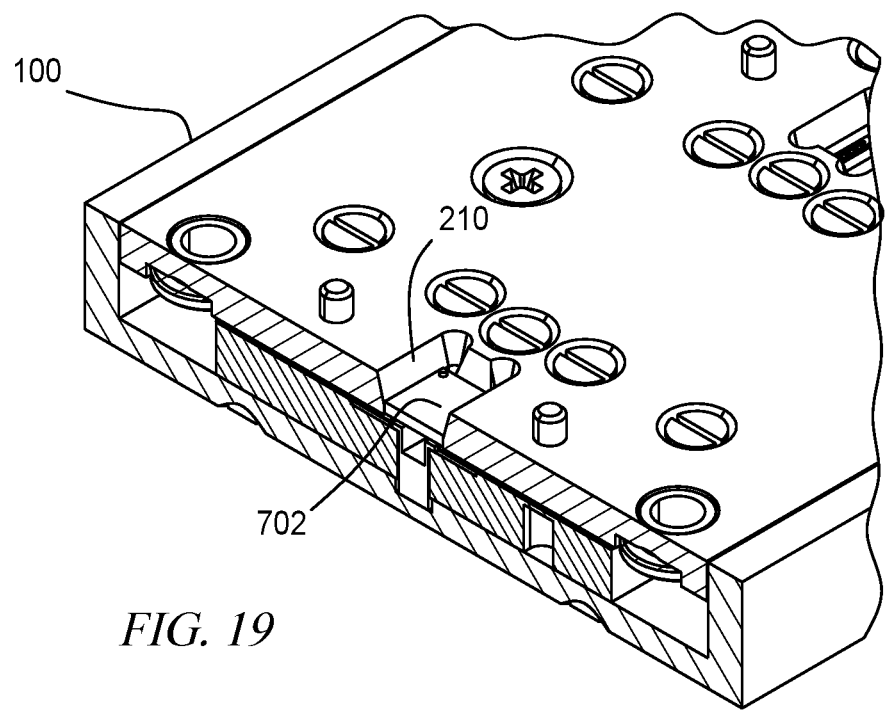
FIG. 19 is a cross-sectional perspective view of the TS of FIG. 1 including a device under test (DUT) inserted into a test site during a test procedure according to one embodiment of the present disclosure.

During the test procedure, the P&P handler 1702 picks up a group of up to 4 DUTs 702 and inserts each DUT 104 into a corresponding one of the site openings 1008 of the test head assembly 1500 and thus into the site openings 210 of the TSs 100A and 100B such as shown in FIG. 19. The upper surface of the site openings 1008 serve as a mechanical hard-stop for the head of the P&P handler 1702 to prevent the head from over-extending into the TSs and damaging the CFAs within. The control unit 1304 instructs the HVH 1302 to apply a high voltage difference between voltage polarities A and B at the appropriate time during the test procedure.

In one embodiment, each DUT 702 is an isolation device or product which is a driver that performs a logic function between inputs and outputs formed by pads 2202 (FIG. 22) of the DUT 702. The high voltage (HV) test gauges the quality of the isolation barrier in the DUT 702 between the input and the output of the device. The isolation barrier protects the user circuitry (output circuits) in the event of sudden voltage surges at the input pins or vice versa. During the HV test, a large potential difference, such as 3 to 6 root-mean-square kilovolts (kVrms), depending upon the particular product, is applied to the voltage polarities A and B and thus to corresponding CFAs 104 and thus across the input and output pins or pads of each DUT 702 via the pair of TBs 110A and 110B, and a leakage current through an isolation barrier of each DUT 702 is measured. The first and second TBs receive first and second polarities A and B, respectively, of the high voltage. The high voltage may be a singular voltage, in which one polarity is a high voltage received by one TB while the other polarity is a reference voltage received at the other TB, or the high voltage may be a differential voltage applied between the voltage polarities A and B and thus between the pair of TBs. The measured leakage current is used as a measure of the quality of the isolation barrier, and if the measured value is below a certain threshold value, the device is considered to have passed the HV test. Functional test may be performed after the HV test using a separate and different setup.

At the end of the HV test procedure, the head of the P&P handler 1702 removes the DUTs from the test head assembly 1500 and may select another group of DUTs 702 for testing, and the procedure may be repeated as often as desired. Although the illustrated DPA 1000 may be used for testing up to 4 DUTs 702 at a time, it may be reconfigured for testing any other suitable number, such as 2 or 8 or 16 or more DUTs 702 at a time depending upon the capabilities of the P&P handler 1702 and the HVH 1302.

FIG. 19 is a cross-sectional perspective view of the TS 100 including a DUT 702 inserted into a test site 210 during the test procedure according to one embodiment of the present disclosure. It is understood that the TS 100 is contained within the DPA 1000 of the test head assembly 1500 mounted to the P&P handler 1702 during the test procedure, but the DPA 1000, the test head assembly 1500 and the P&P handler 1702 are not shown for purposes of illustration.

Figure 20:
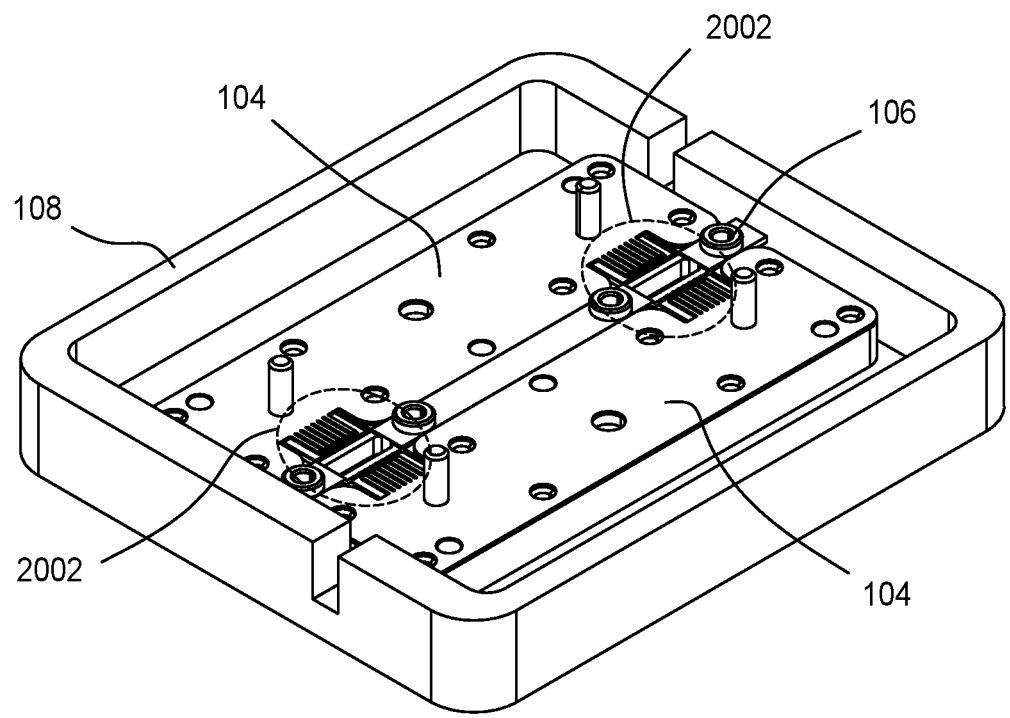
FIG. 20 is a perspective view of the TS of FIG. 1 showing the pair of CFAs mounted within the SBC on either side of a contact finger assembly holder (CFAH) but without the APA for purposes of illustration according to one embodiment of the present disclosure.

FIG. 20 is a perspective view of the TS 100 showing the pair of CFAs 104 mounted within the SBC 108 on either side of the CFAH 106 but without the APA 102 for purposes of illustration according to one embodiment of the present disclosure. The pair of CFAs 104 and the CFAH 106 form two test interfaces 2002 aligned with the site openings 210 within the TS 100 for receiving a pair of DUTs 702, such as shown in FIG. 19. This is the same configuration for each of the CFAs 100A and 100B of the wired TS assembly 900 previously described.

Figure 21:
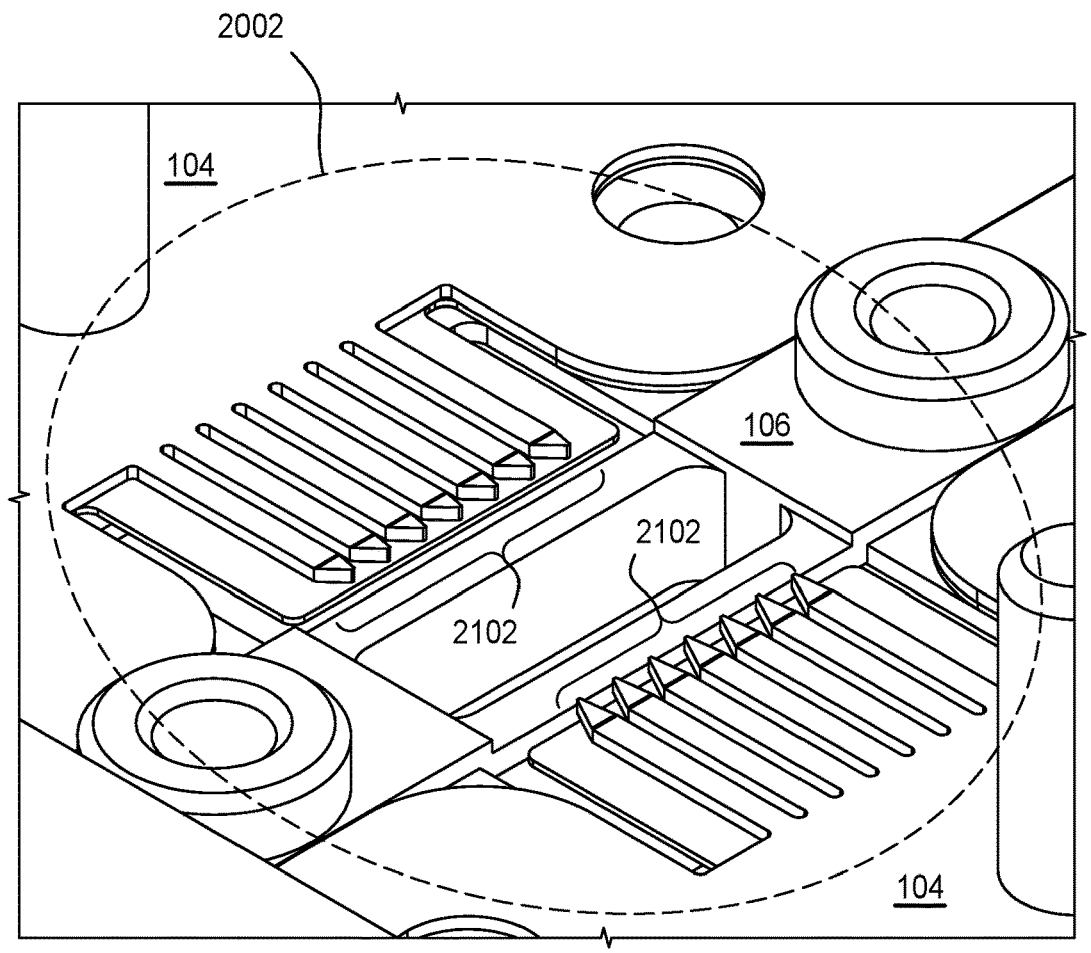
FIG. 21 is a close-up view of test interfaces of FIG. 20 formed by the pair of CFAs and the CFAH according to one embodiment of the present disclosure.

FIG. 21 is a close-up view of the test interfaces 2002 formed by the pair of CFAs 104 and the CFAH 106 according to one embodiment of the present disclosure. Each CFG 112 of each CFA 104 includes the group of elongated conductive contact fingers 2102 in which each finger has a pointed tip that is bent upwards to establish optimal contact with sunken pads of the DUT 702 when inserted for testing. The CFG 112 includes a number of separate contact fingers 2102 similar to the tines of a fork in which the particular number of contact fingers 2102 of the CFG 112 corresponds with the number of pads of the DUT 702. As previously described, one group of conductive contact fingers 2101 receives the voltage polarity A while the opposing group of conductive contact fingers 2101 receives the voltage polarity B at each test interface 2002.

Figure 22:
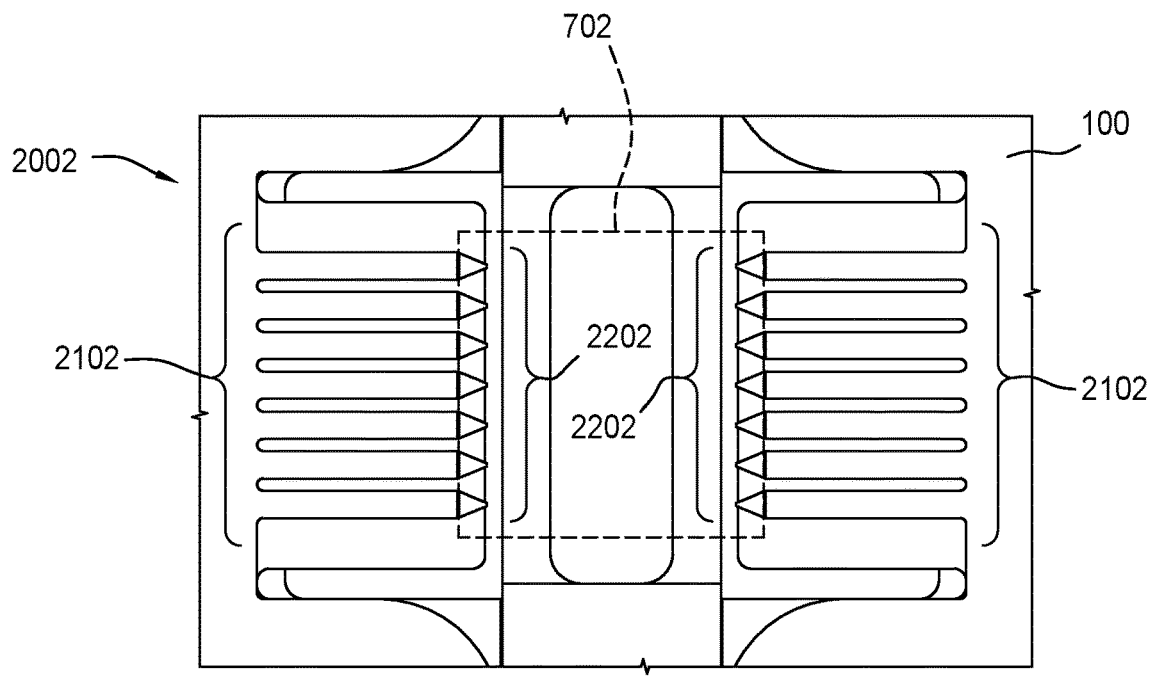
FIG. 22 is a top view of the test interface of FIG. 20 for interfacing the inputs or outputs of a DUT shown in phantom according to one embodiment of the present disclosure.

FIG. 22 is a top view of the test interface 2002 for interfacing the inputs or outputs of a DUT 702 shown in phantom according to one embodiment of the present disclosure. The DUT 702 includes a set of pads 2202 on either side, each pad 2202 electrically interfacing a corresponding contact finger 2102 of a corresponding CFG 112 of a corresponding CFA 104 when the DUT 702 is inserted into the site opening 210 of the TS 100 for testing. As shown, the pointed tip of each contact finger 2102 is aligned with a corresponding pad 2202 of the DUT 702 to establish electrical contact. In this manner, the conductive pads 2202 on one side of the DUT 702 receives the voltage polarity A and the conductive pads 2202 on the opposing side of the DUT 702 receives the voltage polarity B during HV testing.

Figure 23:
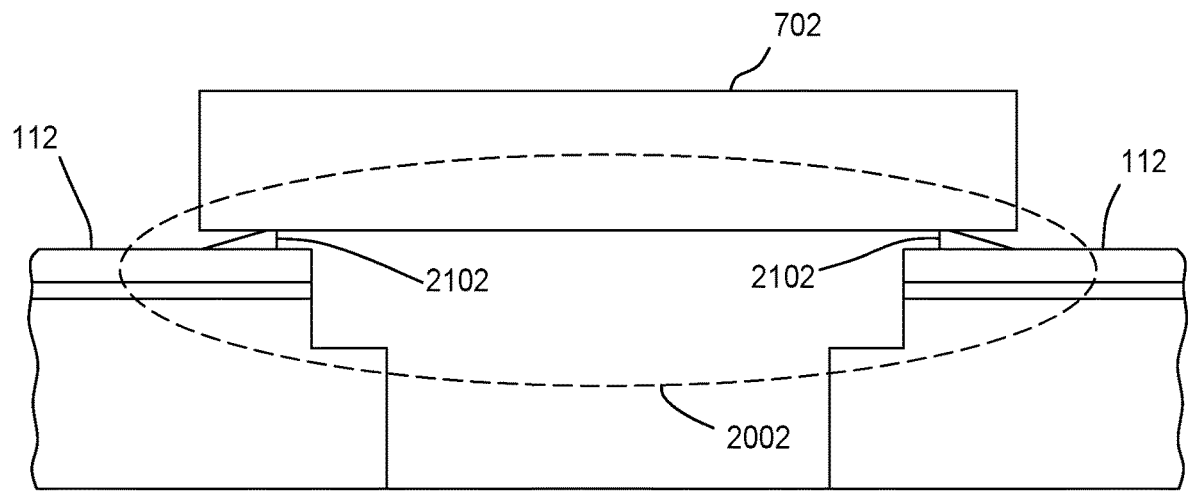
FIG. 23 is a simplified side view of the test interface of FIG. 20 showing an opposite pair of contact fingers of FIG. 21 interfacing opposite sides of a DUT according to one embodiment of the present disclosure.

FIG. 23 is a simplified side view of the test interface 2002 showing an opposite pair of the contact fingers 2102 interfacing opposite sides of the DUT 702 according to one embodiment of the present disclosure. The contact fingers 2102 are manufactured with tips that are manufactured or otherwise bent upwards above the horizontal surface of the CFG 112 to interface the pads 2202 of the DUT 702.

Figure 24:
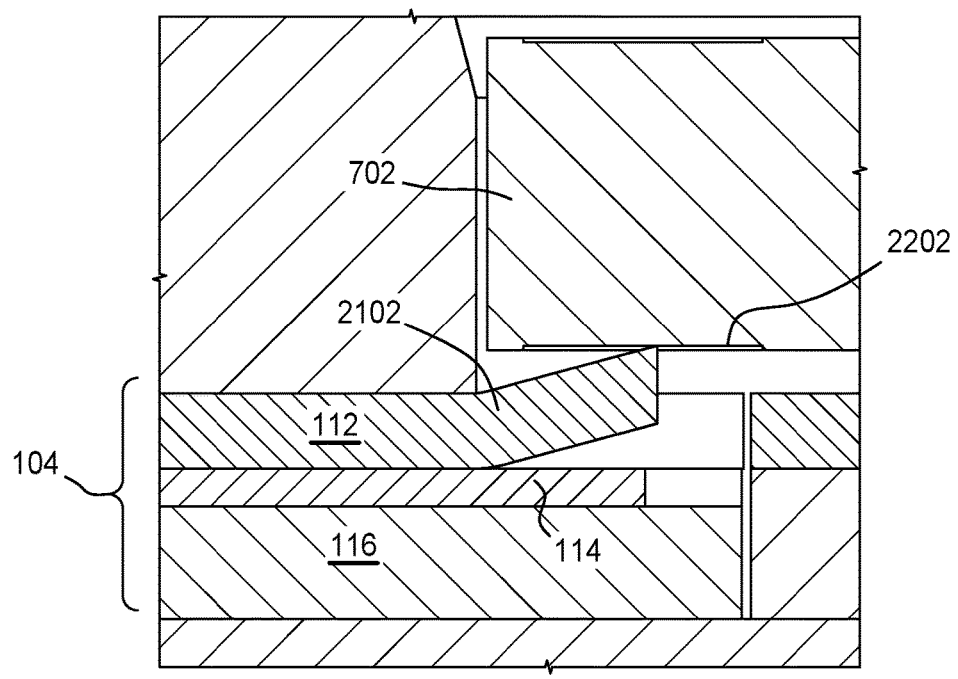
FIG. 24 is a close-up cross-sectional partial side view illustrating a contact finger of the CFG of the CFA of FIG. 1 interfacing a corresponding pad of FIG. 22 of the DUT according to one embodiment of the present disclosure.

FIG. 24 is a close-up cross-sectional partial side view illustrating a contact finger 2102 of the CFG 112 of the CFA 104 interfacing a corresponding pad 2202 of the DUT 702 according to one embodiment of the present disclosure. The CFA 104 is formed by horizontally stacking the CFB 116, the CFS 114 and the CFG 112 together as shown, in which the bent tips of each contact finger 2102 provides a simpler test socket design and ease of assembly.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A test system for high voltage testing of one or more semiconductor devices, comprising:
at least one test socket, each comprising a conductive first contact finger assembly positioned opposite a conductive second contact finger assembly within a hollow area of a socket enclosure to collectively form at least one test interface for a corresponding one of at least one device under test (DUT), wherein the first and second contact finger assemblies each comprise at least one elongated conductor with a bent tip for electrically interfacing a corresponding at least one pad of the at least one DUT, and wherein an upper surface of the socket enclosure comprises at least one site opening for receiving and aligning the at least one DUT with a corresponding one of the at least one test interface; and
a docking plate assembly having a cavity area that embeds the at least one test socket, wherein the docking plate assembly has a first side for mounting to a high voltage test head for applying a high voltage between the first contact finger assembly and the second contact finger assembly, and wherein the docking plate assembly has a second side for mounting to a test area of a pick and place handler for high voltage testing, wherein the second side has at least one site opening each aligned with a corresponding one of the at least one site opening of the socket enclosure for receiving and aligning the at least one DUT with a corresponding one of the at least one test interface.

2. The test system of claim 1, wherein the first contact finger assembly comprises at least one group of first contact fingers in which each group of first contact fingers is positioned to align with a corresponding one of a first set of pads of the DUT at a corresponding one of the at least one test interface, wherein the at least one second contact finger assembly comprises at least one group of second contact fingers in which each group of second contact fingers is positioned to align with a corresponding one of a second set of pads of the DUT at the corresponding one of the at least one test interface, and wherein each of the first contact fingers and each of the second contact fingers comprises an elongated conductor with a bent tip.

3. The test system of claim 1, wherein the first contact finger assembly comprises first and second groups of first contact fingers, wherein the second contact finger assembly comprises first and second groups of second contact fingers, wherein the first group of first contact fingers and the first group of second contact fingers are positioned opposite each other to collectively form a first test interface for a first DUT, and wherein the second group of first contact fingers and the second group of second contact fingers are positioned opposite each other to collectively form a second test interface for a second DUT.

4. The test system of claim 3, wherein the upper surface of the socket enclosure comprises a first site opening for receiving and aligning the first DUT with the first test interface and a second site opening for receiving and aligning the second DUT with the second test interface.

5. The test system of claim 4, wherein the second side of the docking plate assembly has a first site opening aligned with the first site opening of the socket enclosure for receiving and aligning the first DUT and has a second site opening aligned with the second site opening of the socket enclosure for receiving and aligning the second DUT.

6. The test system of claim 1, further comprising a terminal block mounted to a first one of the at least one test socket and electrically interfaced to the first contact finger assembly of the first test socket.

7. The test system of claim 1, further comprising first and second terminal blocks for mounting to at least one of the at least one test socket for receiving and applying a high voltage between the first contact finger assembly and the second contact finger assembly of each of the at least one test interface of each of the at least one test socket.

8. The test system of claim 1, wherein the at least one test socket comprises a first test socket and a second test socket, wherein the first test socket comprises first and second contact finger assemblies in which the first contact finger assembly of the first test socket is electrically connected to a first terminal block, wherein the second test socket comprises first and second contact finger assemblies in which the second contact finger assembly of the second test socket is electrically connected to a second terminal block, wherein the first contact finger assembly of the first test socket is electrically connected to the first contact finger assembly of the second test socket, wherein the second contact finger assembly of the first test socket is electrically connected to the second contact finger assembly of the second test socket.

9. The test system of claim 8, wherein the high voltage test head comprises a first contact pin for electrically connecting to the first terminal block and a second contact pin for electrically connecting the second terminal block when the docking plate assembly embedded with the first and second test sockets is mounted to the high voltage test head.

10. The test system of claim 1, wherein the first contact finger assembly and the second contact finger assembly each comprises a contact finger group, a contact finger support, and a contact finger base in a stacked configuration.

11. The test system of claim 10, wherein the contact finger base comprises a hole for receiving and electrically connecting to a terminal block for conveying high voltage.

12. The test system of claim 10, wherein the contact finger base comprises a solder area for soldering a conductive wire.

13. The test system of claim 1, wherein each test socket further comprises a nonconductive contact finger assembly holder positioned between the first and second contact finger assemblies for spacing and electrical isolation.

14. The test system of claim 1, wherein the bent tip of the elongated conductor comprises a pointed tip.

15. The test system of claim 1, wherein the socket enclosure comprises:
- a socket bottom cover formed with the hollow area; and
- an alignment plate that mates with the socket bottom cover to embed the first and second contact finger assemblies.

16. The test system of claim 15, the alignment plate forms the upper surface of the socket enclosure comprising the at least one site opening.

17. The test system of claim 1, wherein the docket plate assembly comprises:
- a docking plate formed with the cavity area; and
- a back cover that encloses the cavity area of the docking plate to embed the at least one test socket.

18. The test system of claim 17, wherein the back cover comprises at least a portion of the second side of the docking plate assembly comprising at least one site opening each aligned with a corresponding one of the at least one site opening of the socket enclosure.

* * * * *